United States Patent
Michibata

(10) Patent No.: US 11,443,783 B2
(45) Date of Patent: Sep. 13, 2022

(54) SEMICONDUCTOR DEVICE

(71) Applicant: FUJITSU LIMITED, Kawasaki (JP)

(72) Inventor: Kohei Michibata, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 17/308,300

(22) Filed: May 5, 2021

(65) Prior Publication Data

US 2022/0020407 A1    Jan. 20, 2022

(30) Foreign Application Priority Data

Jul. 16, 2020 (JP) .............................. JP2020-122158

(51) Int. Cl.
G11C 7/10 (2006.01)
(52) U.S. Cl.
CPC ................... G11C 7/1057 (2013.01)
(58) Field of Classification Search
CPC ........ G11C 7/1057; G11C 7/22; G11C 7/1087
USPC .................................................. 365/189.05
See application file for complete search history.

(56) References Cited

U.S. PATENT DOCUMENTS

| | | | |
|---|---|---|---|
| 2009/0016350 A1 | 1/2009 | Matsuo et al. | |
| 2012/0036509 A1* | 2/2012 | Srinivasan | G06F 9/526 |
| | | | 713/400 |
| 2018/0173649 A1* | 6/2018 | Kyrychynskyi | G06F 13/161 |

FOREIGN PATENT DOCUMENTS

JP         2009-21872 A       1/2009

* cited by examiner

*Primary Examiner* — Huan Hoang
(74) *Attorney, Agent, or Firm* — WHDA, LLP

(57) ABSTRACT

A semiconductor device includes a memory device configured to have a first buffer and a second buffer, the first buffer storing a plurality of requests sent to a plurality of destinations, the second buffer storing identification information of the entry associated with a first destination of a first request written to first buffer; and an entry selector configured to identify the first destination from the plurality of destinations when the identification information of the entry is stored in the second buffer, and to read the first request from the plurality of requests stored in the first buffer by using the first destination.

6 Claims, 8 Drawing Sheets

SEMICONDUCTOR DEVICE

CROSS-REFERENCE TO RELATED APPLICATION

This application is based upon and claims the benefit of priority of the prior Japanese Patent Application No. 2020-122158, filed on Jul. 16, 2020, the entire contents of which are incorporated herein by reference.

FIELD

The embodiment discussed herein is related to a semiconductor device.

BACKGROUND

First-in, first-out (FIFO) is known as a buffer control method. In FIFO, data written first is fetched first.

In write and read control for a buffer, FIFO is an approach that may be achieved with a plain configuration, only needs a small amount of calculation, and is easy to implement. For example, Japanese Laid-open Patent Publication No. 2009-21872 and the like are disclosed.

SUMMARY

According to an aspect of the embodiments, a semiconductor device includes a semiconductor device includes a memory device configured to have a first buffer and a second buffer, the first buffer storing a plurality of requests sent to a plurality of destinations, the second buffer storing identification information of the entry associated with a first destination of a first request written to first buffer; and an entry selector configured to identify the first destination from the plurality of destinations when the identification information of the entry is stored in the second buffer, and to read the first request from the plurality of requests stored in the first buffer by using the first destination.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

However, in FIFO, when a situation arises in which a request written earlier in a buffer is hindered from transmitting to the destination, a request written later in the buffer is not allowed to be read until the request written earlier is read.

Figure 8:
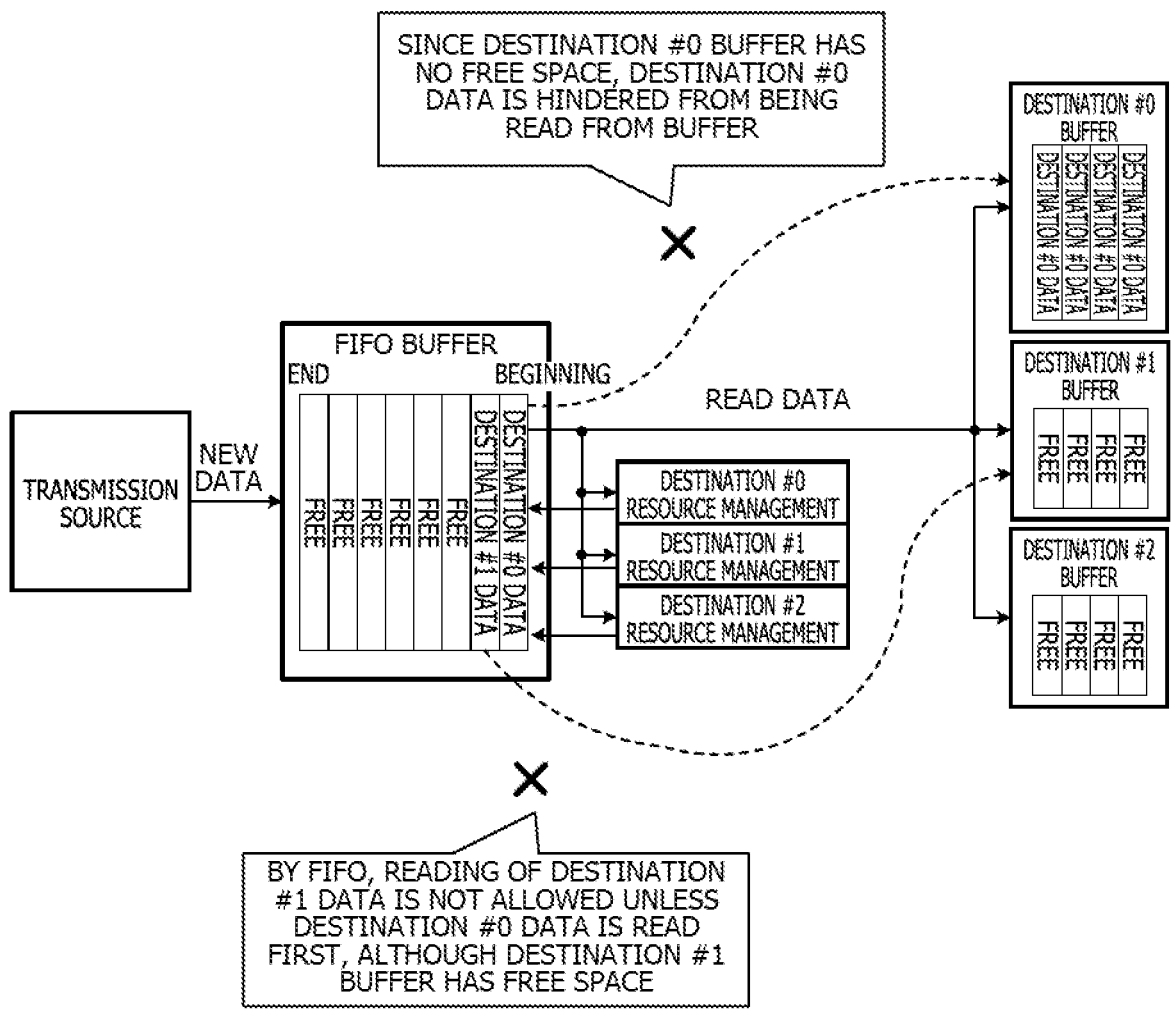
FIG. 8 is a diagram for describing buffer control using FIFO.

FIG. 8 is a diagram for describing buffer control using FIFO.

In FIG. 8, three destination buffers, namely, a destination #0 buffer, a destination #1 buffer, and a destination #2 buffer, are arranged on a downstream side of a FIFO buffer. Additionally, the destination #1 buffer and the destination #2 buffer both have free spaces, but the destination #0 buffer is in a state without free space. Furthermore, a request to be stored in the destination #0 buffer is stored at the beginning of the FIFO buffer, and a request to be stored in the destination #1 buffer is stored following the request for the destination #0 buffer.

A destination #0 resource manager, a destination #1 resource manager, and a destination #2 resource manager manage the free space status of the destination #0 buffer, the destination #1 buffer, and the destination #2 buffer, and notify the FIFO buffer when there is no longer a free space.

In such a state, since the destination #0 buffer has no free space, the request for the destination #0 buffer is hindered from being read from the FIFO buffer. Meanwhile, although the destination #1 buffer has a free space, the request for the destination #1 buffer is not allowed to be read unless the preceding request for the destination #0 buffer is read from the FIFO buffer first.

Therefore, there is a problem that the waiting time until the reading of a request for the destination #1 buffer is allowed increases, causing a decrease in processing capacity on a transmission path in which the destination #1 buffer is placed.

In view of the above, it is desirable to suppress a decrease in processing capacity even when the transmission of the preceding request to the destination is not feasible.

Hereinafter, an embodiment relating to the present semiconductor device will be described with reference to the drawings. However, the embodiment to be described below is merely an example, and there is no intention to exclude application of various modifications and techniques not explicitly described in the embodiment. This means that the present embodiment may be modified in various ways to be implemented without departing from the spirit of the embodiment. Furthermore, each drawing is not intended to include only the constituent elements illustrated in the drawing, and may include other functions and the like.

(A) Configuration

Figure 1:
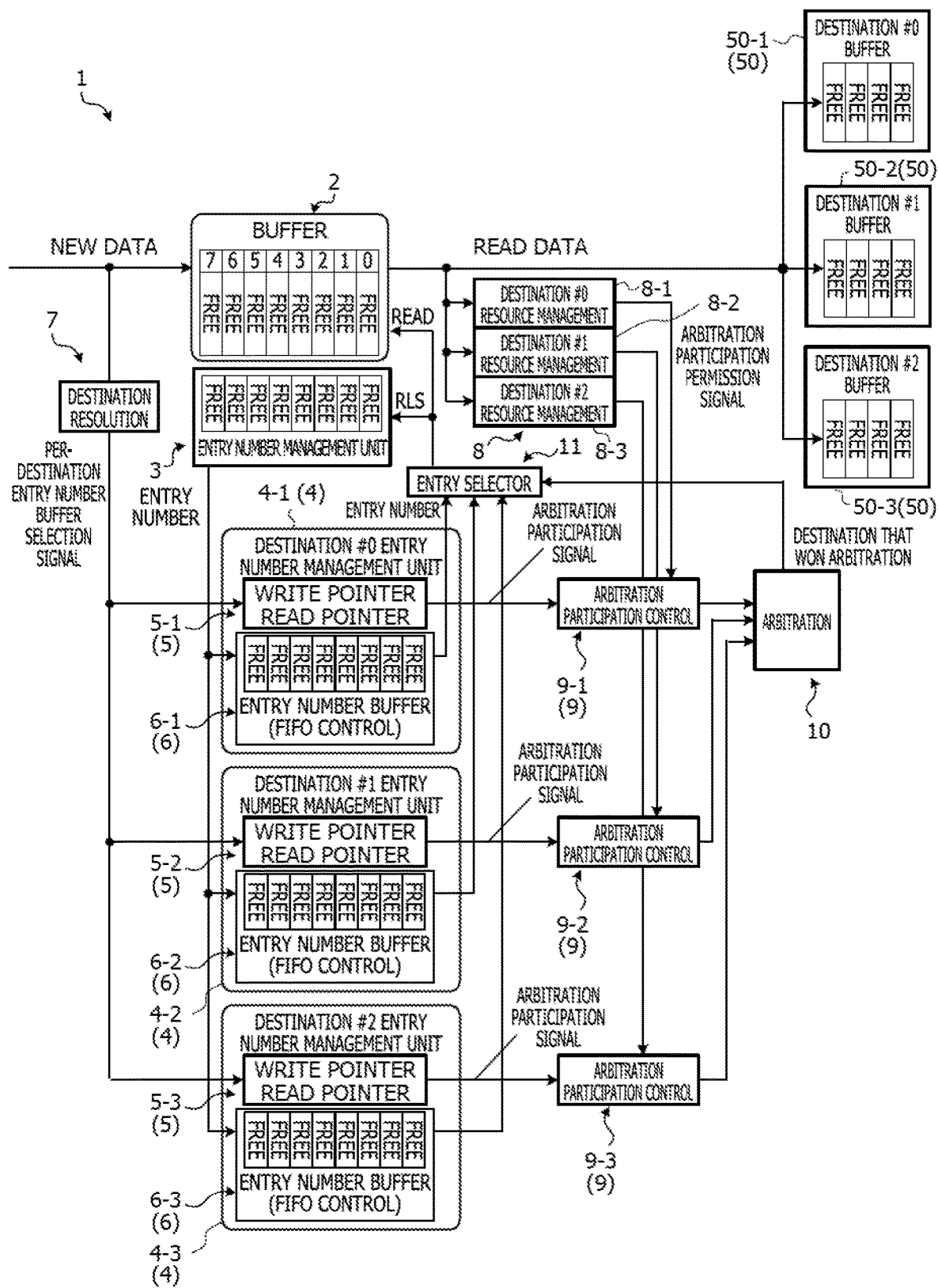
FIG. 1 is a diagram schematically illustrating a configuration of a buffer control system as an example of an embodiment.

FIG. 1 is a diagram schematically illustrating a configuration of a buffer control system 1 as an example of the embodiment.

The buffer control system 1 is a semiconductor device that temporarily stores a request transmitted from a transmission source (not illustrated) and then transfers the stored request to a destination buffer 50, which is the destination. The request may be called data.

In the example illustrated in FIG. 1, the destination buffers 50 include a destination #0 buffer 50-1, a destination #1 buffer 50-2, and a destination #2 buffer 50-3. The destination #0 buffer 50-1, the destination #1 buffer 50-2, and the destination #2 buffer 50-3 each have a plurality of (four in the example illustrated in FIG. 1) memory areas (storage areas), and a request transmitted from the transmission source is stored in one of these memory areas.

Hereinafter, when the destination #0 buffer 50-1, the destination #1 buffer 50-2, and the destination #2 buffer 50-3 are not particularly distinguished, they are written as the destination buffers 50. In the plurality of memory areas provided in the destination buffers 50, a memory area in which data is not stored will be sometimes referred to as a free area.

As illustrated in FIG. 1, the buffer control system 1 includes a buffer 2, an entry number management unit 3, a destination #0 entry number management unit 4-1, a destination #1 entry number management unit 4-2, a destination #2 entry number management unit 4-3, write/read pointers 5-1 to 5-3, entry number buffers 6-1 to 6-3, a destination resolution unit 7, a destination resource management unit 8, arbitration participation control units 9-1 to 9-3, an arbitration unit 10, and an entry selector 11.

The buffer 2 is a memory device (memory) that temporarily stores requests (data) that have been transmitted from the transmission source and are to be transferred to the destination buffers 50. The buffer 2 is achieved by, for example, a random access memory.

The buffer 2 has a plurality of (eight in the example illustrated in FIG. 1) memory areas (data storage areas), and requests transmitted from the transmission source are stored in these memory areas. These memory areas in the buffer 2 are sometimes referred to as entries. Each entry is specified by an entry number (entry No.), which is unique identification information.

The buffer 2 corresponds to a first buffer in which a plurality of requests to be sent to a plurality of destinations (destination buffers 50) is written.

The request stored in the entry of the buffer 2 is read in accordance with an instruction from the entry selector 11 described later, and is written into a memory area of the destination buffer 50 that is the destination of the request.

Furthermore, in the entry from which the request has been read, the stored request is deleted, and a state in which no data is stored is restored. In the example illustrated in FIG. 1, "free" is displayed for the entry in a state in which no data is stored. In the buffer 2, the entry in which no data is stored may be called a free entry.

The writing and reading of data for the buffer 2 may be performed by a buffer control unit (not illustrated).

The entry number management unit 3 manages the usage status (free space status) of the entries in the buffer 2. The entry number management unit 3 has a plurality of (eight in the example illustrated in FIG. 1) memory areas in one-to-one correspondence to the entries of the buffer 2. Then, the entry number management unit 3 stores, in an entry of the buffer 2 in which a request is stored, identification information indicating that data is stored in a memory area corresponding to the entry (in the example illustrated in FIG. 3, "in use" is displayed). In this manner, the entry number management unit 3 manages which entry of the buffer 2 is in use.

Furthermore, the entry number management unit 3 stores identification information indicating that no data (request) is stored in a memory area corresponding to an entry of the buffer 2 in which no request is stored (in the example illustrated in FIG. 1, "free" is displayed).

In addition, when notified of the entry number together with a release instruction from the entry selector 11 described later, the entry number management unit 3 sets identification information ("free" in the state illustrated in FIG. 1) indicating that no data is stored in a memory area corresponding to the notified entry number.

The destination #0 entry number management unit 4-1 manages an entry of the buffer 2 that stores data whose destination is the destination #0 buffer 50-1.

The destination #0 entry number management unit 4-1 includes the write/read pointer 5-1 and the entry number buffer 6-1.

The entry number buffer 6-1 stores the entry number of an entry that stores data whose destination is the destination #0 buffer 50-1, among the plurality of entries provided in the buffer 2. The entry number buffer 6-1 has a plurality of (eight in the example illustrated in FIG. 1) memory areas, and the entry numbers of entries that store data whose destination is the destination #0 buffer 50-1 are stored in these memory areas.

The entry number buffer 6-1 is controlled by FIFO, and data having the longest elapsed time since the data was stored, which is the oldest data, is output first. The output of the entry number buffer 6-1 is input to the entry selector 11.

This means that, in the present buffer control system 1, the order of a plurality of requests having the same destination is maintained.

The write/read pointer 5-1 manages the write position and the read position of data (the entry number of an entry that stores data whose destination is the destination #0 buffer 50-1) in the entry number buffer 6-1. The write/read pointer 5-1 includes a write pointer that indicates the write position and a read pointer that indicates the read position. The write pointer represents a memory area (free area) into which data is supposed to be written next, among the plurality of memory areas provided in the entry number buffer 6-1.

The read pointer represents a memory area from which data is supposed to be read next, among the plurality of memory areas provided in the entry number buffer 6-1.

As described above, the entry number buffer 6-1 writes and reads data under FIFO control. Therefore, in the write/read pointer 5, the read pointer indicates the position of a memory area of the entry number buffer 6-1 in which the oldest data is stored. Note that, when unread data is stored in the entry number buffer 6-1, the position indicated by the write pointer and the position indicated by the read pointer are different. On the other hand, when no unread data is stored in the entry number buffer 6-1, the position indicated by the write pointer and the position indicated by the read pointer match.

The write/read pointer 5-1 inputs an arbitration participation signal to the arbitration participation control unit 9-1 when unread data is stored in the entry number buffer 6-1, which is when the position indicated by the write pointer and the position indicated by the read pointer are different.

On the other hand, the write/read pointer 5-1 restricts the input of the arbitration participation signal to the arbitration participation control unit 9-1 when no unread data is stored in the entry number buffer 6-1, which is when the position indicated by the write pointer and the position indicated by the read pointer are the same.

The destination #1 entry number management unit 4-2 manages an entry of the buffer 2 that stores data whose destination is the destination #1 buffer 50-2. The destination #1 entry number management unit 4-2 includes the write/read pointer 5-2 and the entry number buffer 6-2.

The write/read pointer 5-2 and the entry number buffer 6-2 of the destination #1 buffer 50-2 functions similarly to the write/read pointer 5-1 and the entry number buffer 6-1 of the destination #0 buffer 50-1. Note that, for convenience, specific description of the function of each of these units will be omitted.

The destination #2 entry number management unit 4-3 manages an entry of the buffer 2 that stores data whose destination is the destination #2 buffer 50-3. The destination #2 entry number management unit 4-3 includes the write/read pointer 5-3 and the entry number buffer 6-3.

The write/read pointer 5-3 and the entry number buffer 6-3 of the destination #2 buffer 50-3 functions similarly to the write/read pointer 5-1 and the entry number buffer 6-1 of the destination #0 buffer 50-1. Note that, for convenience, specific description of the function of each of these units will be omitted.

Hereinafter, when the destination #0 entry number management unit 4-1, the destination #1 entry number management unit 4-2, and the destination #2 entry number management unit 4-3 are not distinguished, they are sometimes referred to as per-destination entry management units 4.

Furthermore, hereinafter, when the write/read pointers 5-1 to 5-3 are not distinguished, they are sometimes referred to as write/read pointers 5. Moreover, when the entry number buffers 6-1 to 6-3 are not distinguished, they are sometimes referred to as entry number buffers 6. The entry number buffers 6-1 to 6-3 correspond to a plurality of second buffers provided for each destination buffer 50.

In the present buffer control system 1, when a request is written into the buffer 2, the entry number of an entry of the buffer 2 in which this request is written is stored in the entry number buffer 6 corresponding to the destination of the request.

The entry number management unit 3 is connected to each entry number buffer 6, and the entry number notified from the entry number management unit 3 is stored in a free area indicated by the pointer of the write/read pointer 5 that indicates the write position. Furthermore, each entry number buffer 6 is connected to the entry selector 11 described later, and data read from a memory area indicated by the pointer of the write/read pointer 5 that indicates the read position is sent to the entry selector 11.

The destination resolution unit 7 specifies the destination (the sending destination, the destination buffer 50) of a request from the transmission source, and inputs a notification signal (destination entry number buffer selection signal) to the write/read pointer 5 of the per-destination entry management unit 4 corresponding to the specified destination buffer 50.

The per-destination entry management unit 4 may detect that data has been written into a free entry of the buffer 2, for example, by using the reception of this destination entry number buffer selection signal as a trigger. For example, by using the reception of the destination entry number buffer selection signal as a trigger, the entry number may be set in the entry number buffer 6 or the write/read pointer 5 may be updated.

The destination resource management unit 8 manages the usage status of the destination buffers 50. The destination resource management unit 8 includes a destination #0 resource management unit 8-1, a destination #1 resource management unit 8-2, and a destination #2 resource management unit 8-3.

The destination #0 resource management unit 8-1 manages the usage status of the destination #0 buffer 50-1. The destination #0 resource management unit 8-1 includes a counter that counts the number of memory areas in use for storing data in the destination #0 buffer 50-1. When the destination #0 buffer 50-1 has a free area, the destination #0 resource management unit 8-1 inputs an arbitration participation permission signal to the arbitration participation control unit 9-1 described later.

The destination #1 resource management unit 8-2 manages the usage status of the destination #1 buffer 50-2. The destination #1 resource management unit 8-2 includes a counter that counts the number of memory areas in use for storing data in the destination #1 buffer 50-2. When the destination #1 buffer 50-2 has a free area, the destination #1 resource management unit 8-2 inputs the arbitration participation permission signal to the arbitration participation control unit 9-2.

The destination #2 resource management unit 8-3 manages the usage status of the destination #2 buffer 50-3. The destination #2 resource management unit 8-3 includes a counter that counts the number of memory areas in use for storing data in the destination #2 buffer 50-3. When the destination #2 buffer 50-3 has a free area, the destination #2 resource management unit 8-3 inputs the arbitration participation permission signal to the arbitration participation control unit 9-3.

The arbitration unit 10 performs arbitration for a plurality of write requests destined for different destination buffers 50. In response to a plurality of write requests destined for two or more destination buffers 50 among the destination #0 buffer 50-1, the destination #1 buffer 50-2, and the destination #2 buffer 50-3, the arbitration unit 10 performs arbitration to select one destination (destination buffer 50).

The arbitration unit 10 inputs information that specifies the destination (destination buffer 50) that won the arbitration as a result of the arbitration, to the entry selector 11.

As an approach for the arbitration unit 10 to select one write request (one destination buffer 50) from among write requests for the plurality of destination buffers 50, various known approaches may be applied. For example, the arbitration unit 10 may randomly select one write request (one destination buffer 50) from among write requests for the plurality of destination buffers 50. Furthermore, the arbitration unit 10 may select one write request (one destination buffer 50) from among write requests for the plurality of destination buffers 50 in a predetermined order. Moreover, the arbitration unit 10 may set a weight to the process for a specified destination and give priority to the process.

Note that, this example indicates that one write request (destination buffer 50) is selected, but the embodiment is not limited to this example. For example, when writing into the plurality of destination buffers 50 in parallel is enabled, two or more write requests (destination buffers 50) may be selected, and a change may be appropriately adopted in implementation.

Note that, when a write request destined for the destination buffer 50 is input only from any one of the per-destination entry management units 4, the arbitration unit 10 inputs information that specifies the destination (destination buffer 50) of the one write request, to the entry selector 11.

In the present buffer control system 1, when the entry numbers are stored in the entry number buffer 6, the arbitration unit 10 performs arbitration for destinations determined by the arbitration participation control unit 9 described later to be available for the transmission of requests, thereby designating the destination to which one of the requests is to be sent.

The arbitration participation control unit 9-1 designates whether or not participation in arbitration is permitted, in response to the arbitration participation signal input from the destination #0 entry number management unit 4-1, based on the arbitration participation permission signal transmitted from the destination #0 resource management unit 8-1.

The arbitration participation control unit 9-1 inputs a write request (arbitration participation notification) for the destination #0 buffer 50-1 to the arbitration unit 10 when the arbitration participation permission signal is input from the destination #0 resource management unit 8-1 in a case where the arbitration participation signal is input from the destination #0 entry number management unit 4-1.

The arbitration participation control unit 9-2 designates whether or not participation in arbitration is permitted, in response to the arbitration participation signal input from the destination #1 entry number management unit 4-2, based on the arbitration participation permission signal transmitted from the destination #1 resource management unit 8-2.

The arbitration participation control unit 9-2 inputs a write request (arbitration participation notification) for the destination #1 buffer 50-2 to the arbitration unit 10 when the arbitration participation permission signal is input from the destination #1 resource management unit 8-2 in a case where the arbitration participation signal is input from the destination #1 entry number management unit 4-2.

The arbitration participation control unit 9-3 designates whether or not participation in arbitration is permitted, in response to the arbitration participation signal input from the destination #2 entry number management unit 4-3, based on the arbitration participation permission signal transmitted from the destination #2 resource management unit 8-3.

The arbitration participation control unit 9-3 inputs a write request (arbitration participation notification) for the destination #2 buffer 50-3 to the arbitration unit 10 when the arbitration participation permission signal is input from the destination #2 resource management unit 8-3 in a case where the arbitration participation signal is input from the destination #2 entry number management unit 4-3.

Hereinafter, when the arbitration participation control units 9-1 to 9-3 are not particularly distinguished, they are written as arbitration participation control units 9. In the present buffer control system 1, when the entry number is stored in the entry number buffer 6, the arbitration participation control unit 9 determines whether or not the transmission of a request to the destination buffer 50 is permitted.

The arbitration unit 10 is connected to the entry selector 11, and information on the destination that won the arbitration is input to the entry selector 11 from this arbitration unit 10. Furthermore, each per-destination entry management unit 4 is connected to the entry selector 11, and the entry number is input to the entry selector 11 from each per-destination entry management unit 4.

Based on a destination that won the arbitration, which has been input from the arbitration unit 10, the entry selector 11 selects an entry number corresponding to the destination, which has been input from the per-destination entry management unit 4. Then, the entry selector 11 causes the buffer 2 to read data from an entry specified by this selected entry number.

The entry selector 11 causes the request to be read from an entry of the buffer 2 specified by the entry number acquired from the entry number buffer 6 corresponding to the destination buffer 50 designated by the arbitration unit 10.

The request read from the entry of the buffer 2 is stored in the destination buffer 50 that is the destination of the read request.

Furthermore, for an entry from which the stored request has been read and conveyed to the destination buffer 50, the entry selector 11 causes the entry number management unit 3 to set identification information indicating that no request is stored in a memory area corresponding to the entry ("free" in the state illustrated in FIG. 1).

The entry selector 11 inputs a release instruction (release (RLS)) to the entry number management unit 3 together with information (for example, the entry number) indicating an entry from which the request has been read and conveyed to the destination buffer 50. Based on the entry number notified together with this release instruction, the entry number management unit 3 sets identification information ("free" in the state illustrated in FIG. 1) indicating that no request is stored in a memory area corresponding to the entry.

(B) Operation

The process in the buffer control system 1 as an example of the embodiment configured as described above will be described with reference to FIGS. 2 to 7.

First, a process of writing a request into the buffer 2 will be described with reference to FIGS. 2 to 4. Note that FIG. 2 illustrates an initial state of the present buffer control system 1.

Figure 2:
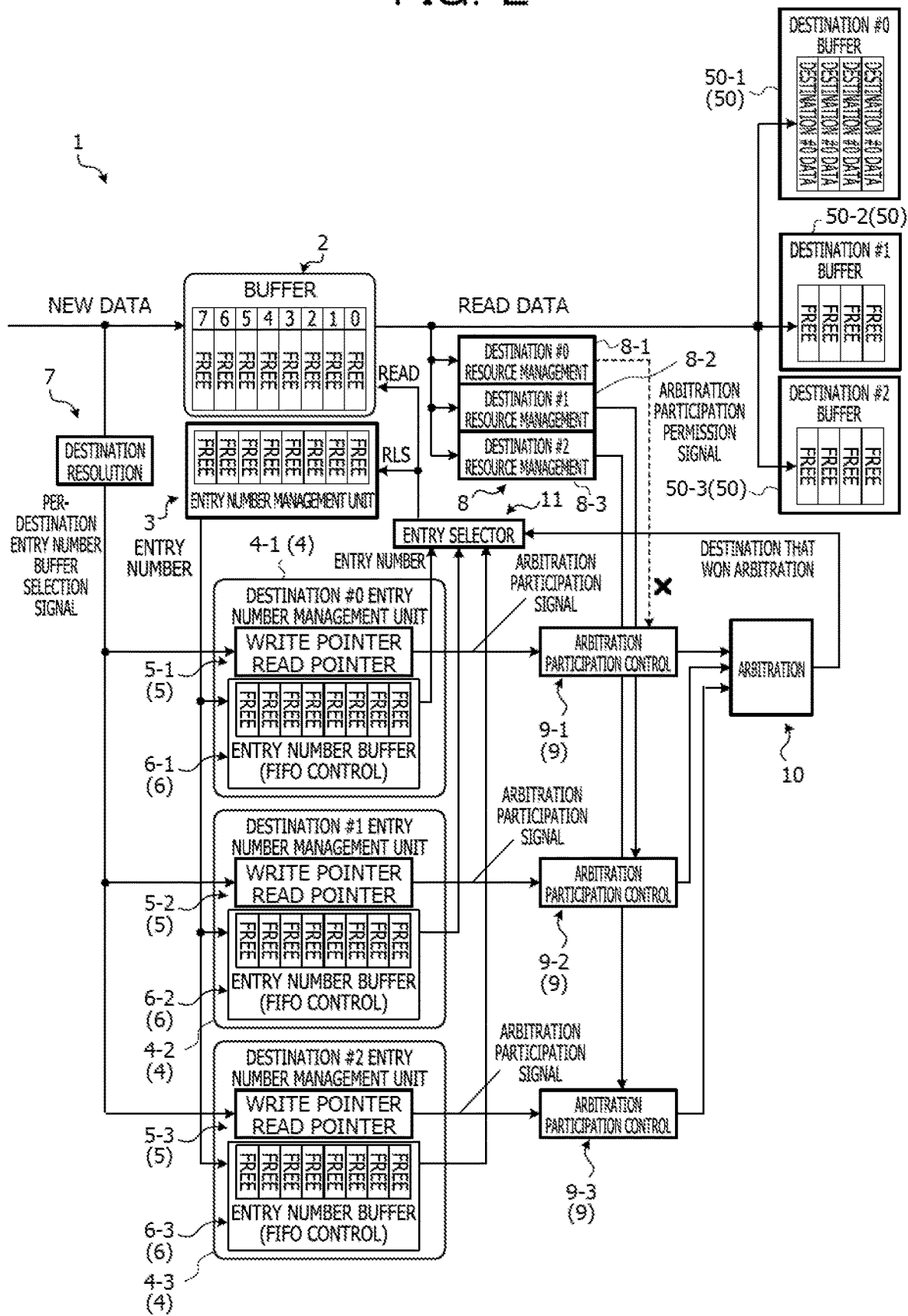
FIG. 2 is a diagram for describing a process in the buffer control system as an example of the embodiment.

In the initial state illustrated in FIG. 2, the plurality of memory areas of the destination #0 buffer 50-1 are all used and is in a state without free space. If the buffer 2 receives a request destined for the destination #0 buffer 50-1, the received request is not allowed to be read from the buffer 2 until a free space is produced in the destination #0 buffer 50-1.

In such a state, it is assumed that the transmission source further issues a new request for the destination #0 buffer 50-1.

Figure 3:
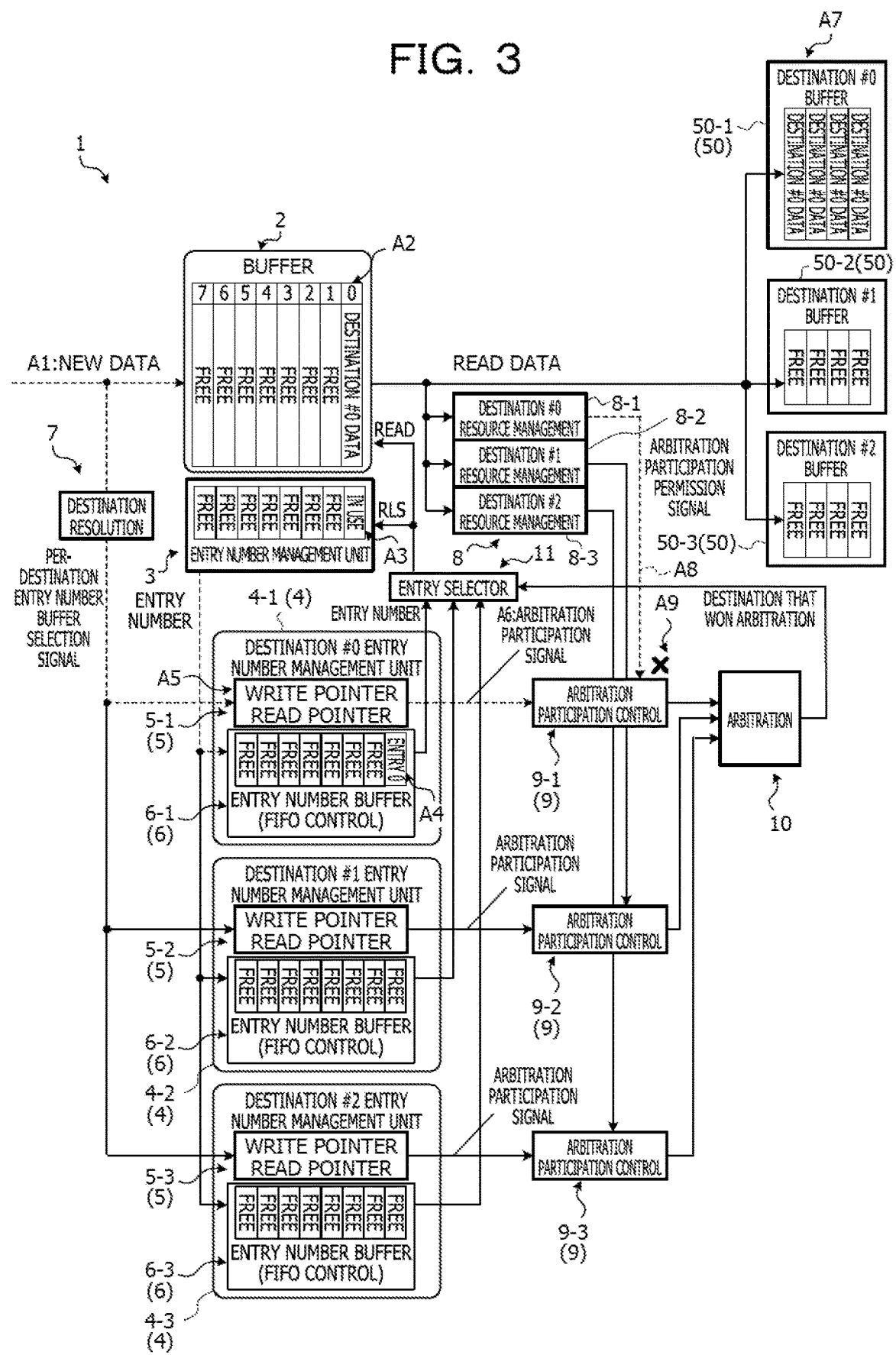
FIG. 3 is a diagram for describing a process in the buffer control system as an example of the embodiment.

First, the buffer 2 receives the new request destined for the destination #0 buffer 50-1 (bound for the destination #0) from the transmission source (see reference sign A1 in FIG. 3).

The buffer control unit confirms a free entry in the buffer 2 by referring to the entry number management unit 3, and writes the received request into this free entry (see reference sign A2 in FIG. 3). In the example illustrated in FIG. 3, the newly received request is written in an entry 0.

At the same time, the entry number management unit 3 sets "in use" indicating that the request is stored in a memory area corresponding to the entry 0 into which data has been written (see reference sign A3 in FIG. 3).

Furthermore, the destination resolution unit 7 confirms the destination of the request at the same time as writing the request into the free entry of the buffer 2 described above, and writes the entry number of the written entry into the entry number buffer 6-1 corresponding to the destination of the request (in this example, the destination #0 buffer 50-1) (see reference sign A4 in FIG. 3).

Moreover, in the destination #0 entry number management unit 4-1, the write/read pointer 5-1 increments the write pointer indicating the write position of the entry number in the entry number buffer 6-1 at the same time as writing the data into the free entry of the buffer 2 described above (see reference sign A5 in FIG. 3).

When the write pointer is updated in the write/read pointer 5-1 and the position indicated by the write pointer and the position indicated by the read pointer are different, the write/read pointer 5-1 generates the arbitration participation signal for reading, and outputs the generated arbitration participation signal to the arbitration participation control unit 9-1 (see reference sign A6 in FIG. 3).

Here, since the destination #0 buffer 50-1 has no free area (see reference sign A7 in FIG. 3), the arbitration participation permission signal from the destination #0 resource management unit 8-1 is invalid (see reference sign A8 in FIG. 3), and as a result, arbitration participation is restricted by the arbitration participation control unit 9-1 (see reference sign A9 in FIG. 3).

Thereafter, it is assumed that a new request for the destination #1 buffer 50-2 is issued from the transmission source.

Figure 4:
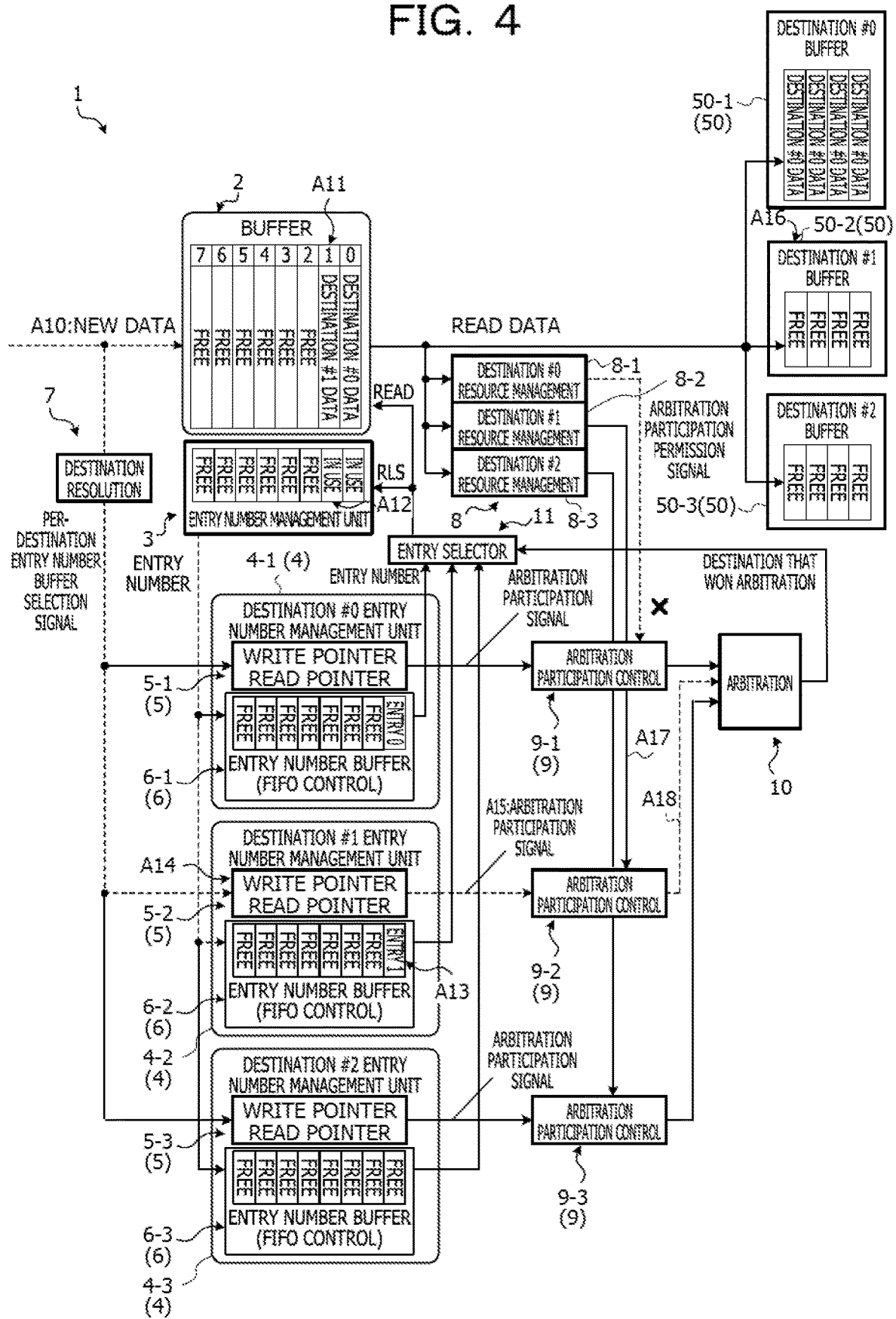
FIG. 4 is a diagram for describing a process in the buffer control system as an example of the embodiment.

The buffer 2 receives the new request destined for the destination #1 buffer 50-2 (bound for the destination #1) from the transmission source (see reference sign A10 in FIG. 4).

The buffer control unit confirms a free entry in the buffer 2 by referring to the entry number management unit 3, and writes the received request into this free entry (see reference sign A11 in FIG. 4).

At the same time, the entry number management unit 3 sets "in use" indicating that the request is stored in a memory area corresponding to an entry 1 into which the request has been written (see reference sign A12 in FIG. 4).

Furthermore, the destination resolution unit 7 confirms the destination of the request at the same time as writing the request into the free entry of the buffer 2 described above, and writes the entry number of the written entry into the entry number buffer 6-2 corresponding to the destination of the request (in this example, the destination #1 buffer 50-2) (see reference sign A13 in FIG. 4).

Moreover, in the destination #1 entry number management unit 4-2, the write/read pointer 5-2 increments the write pointer indicating the write position of the entry number in the entry number buffer 6-2 at the same time as writing the request into the free entry of the buffer 2 described above (see reference sign A14 in FIG. 4).

When the write pointer is updated in the write/read pointer 5-2 and the position indicated by the write pointer and the position indicated by the read pointer are different, the write/read pointer 5-2 generates the arbitration participation signal for reading, and outputs the generated arbitration participation signal to the arbitration participation control unit 9-2 (see reference sign A15 in FIG. 4).

Here, since the destination #1 buffer 50-2 has a free area (see reference sign A16 in FIG. 4), the arbitration participation permission signal from the destination #1 resource management unit 8-2 is valid (see reference sign A17 in FIG. 4), and as a result, arbitration participation is not restricted by the arbitration participation control unit 9-2, such that arbitration participation is allowed (see reference sign A18 in FIG. 4).

After the writing of the request into the buffer 2 is completed as described above, a process of reading the request from the buffer 2 is subsequently performed as illustrated below.

The process of reading the request from the buffer 2 will be described with reference to FIGS. 5 to 7.

The entry number at the position pointed to by the read pointer is output to the entry selector 11 from the per-destination entry management unit 4 in which the entry number is stored in the entry number buffer 6.

Figure 5:
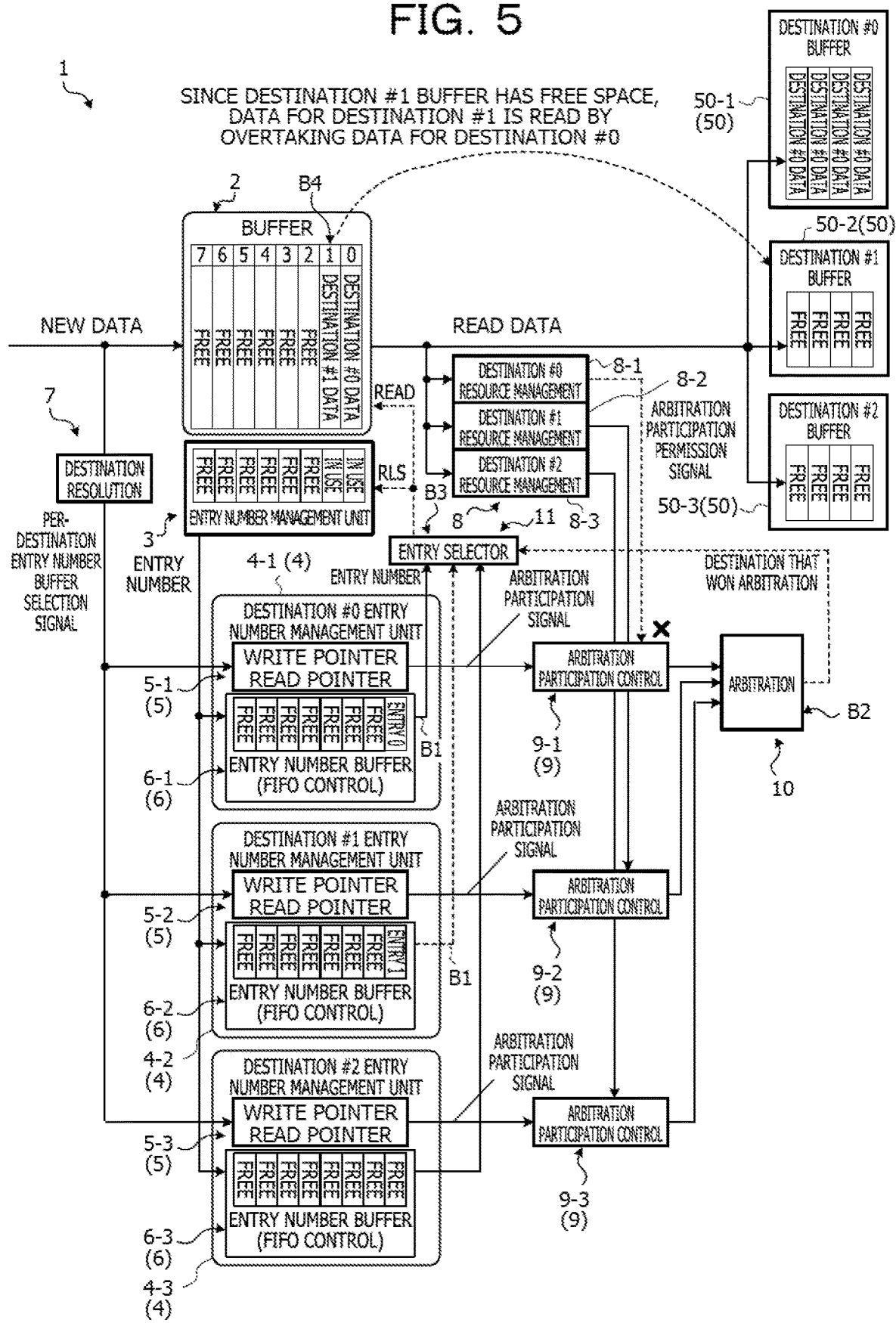
FIG. 5 is a diagram for describing a process in the buffer control system as an example of the embodiment.

In the example illustrated in FIG. 5, "entry 0" and "entry 1" are output to the entry selector 11 from the entry number buffer 6-1 of the destination #0 entry number management unit 4-1 and the entry number buffer 6-2 of the destination #1 entry number management unit 4-2, respectively (see B1 in FIG. 5).

The arbitration unit 10 performs arbitration between destinations, and designates which destination entry number buffer 6 is selected. In the example illustrated in FIG. 5, since the arbitration participation permission signal is not output from the destination #0 resource management unit 8-1 to the arbitration participation control unit 9-1, the request for the destination #1 buffer 50-2 relating to the destination #1 entry number management unit 4-2 wins (see reference sign B2 in FIG. 5).

The entry selector 11 selects the entry number of the destination that won the arbitration. In the example illustrated in FIG. 5, the entry selector 11 selects the entry 1 (see reference sign B3 in FIG. 5). The entry selector 11 reads the request at the position indicated by the selected entry number from the buffer 2. In the example illustrated in FIG. 5, the request is read from the entry 1 of the buffer 2 (see reference sign B4 in FIG. 5). At this time, the preceding request for the destination #0 buffer 50-1 stored in the buffer 2 is overtaken, and the following request for the destination #1 buffer 50-2 stored in the buffer 2 is processed first.

Figure 6:
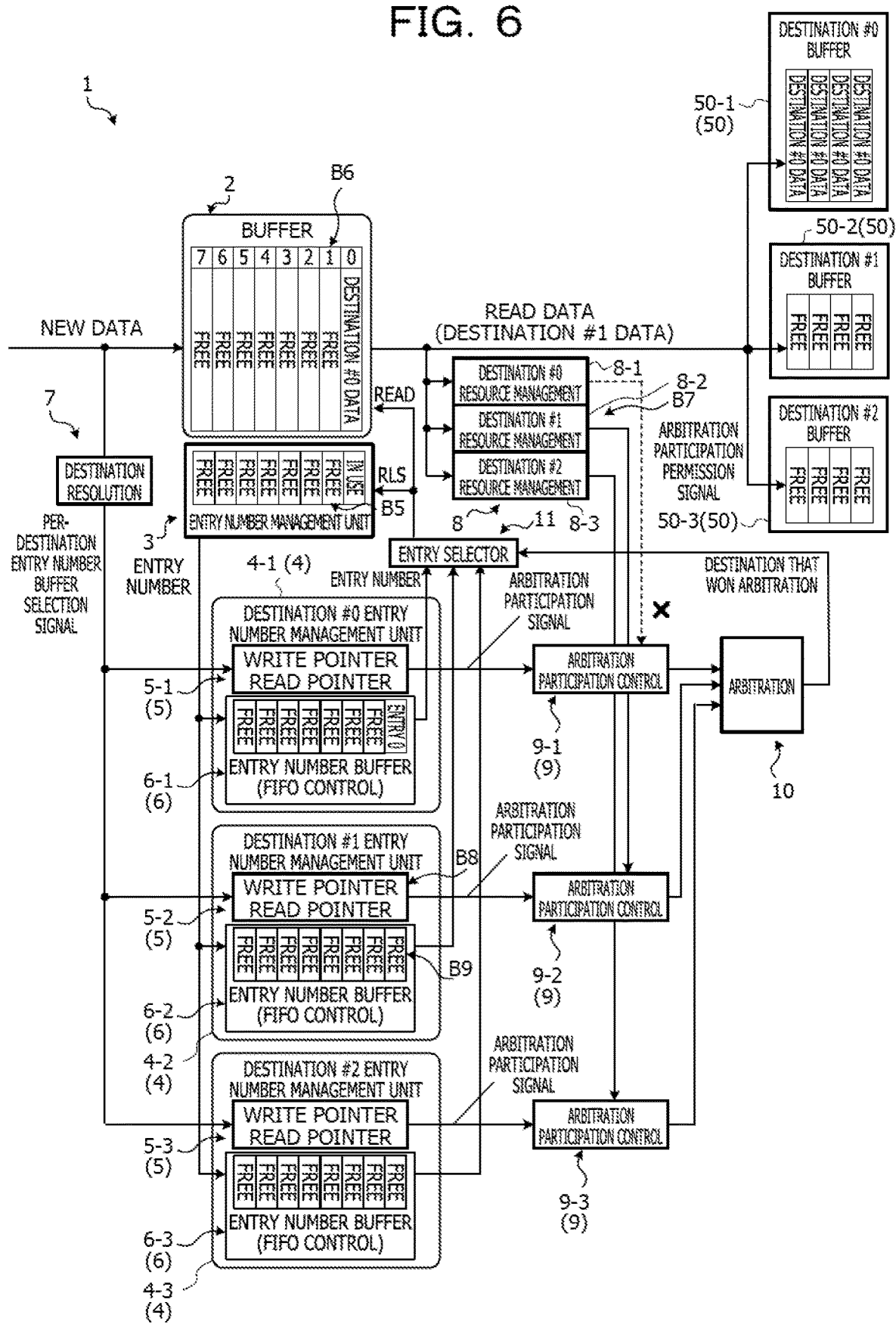
FIG. 6 is a diagram for describing a process in the buffer control system as an example of the embodiment.

After reading the request from the buffer 2, the entry selector 11 causes the memory area of the entry number management unit 3 corresponding to the entry number of the entry of the buffer 2 from which the request has been fetched, to change from "in use" to "free" (see reference sign B5 in FIG. 6).

Furthermore, together with the change from "in use" to "free" in the entry number management unit 3, the memory area corresponding to the entry number of the entry of the buffer 2 from which the request has been read is changed to "free" (see reference sign B6 in FIG. 6). This brings about a state in which the entry of the buffer 2 becomes reusable.

Moreover, together with the change from "in use" to "free" in the entry number management unit 3, the counter (not illustrated) of the destination #1 resource management unit 8-2 is incremented (reference sign B7 in FIG. 6).

In addition, at the same time as the change from "in use" to "free" in the entry number management unit 3, the write/read pointer 5-2 of the destination #1 entry number management unit 4-2 associated with the destination #1 buffer 50-2 as the destination increments its read pointer (reference sign B8 in FIG. 6).

Moreover, at the same time as the change from "in use" to "free" in the entry number management unit 3, the memory area at the beginning of the entry number buffer 6-2 of the destination #1 entry number management unit 4-2 is changed to "free" (see reference sign B9 FIG. 6).

Figure 7:
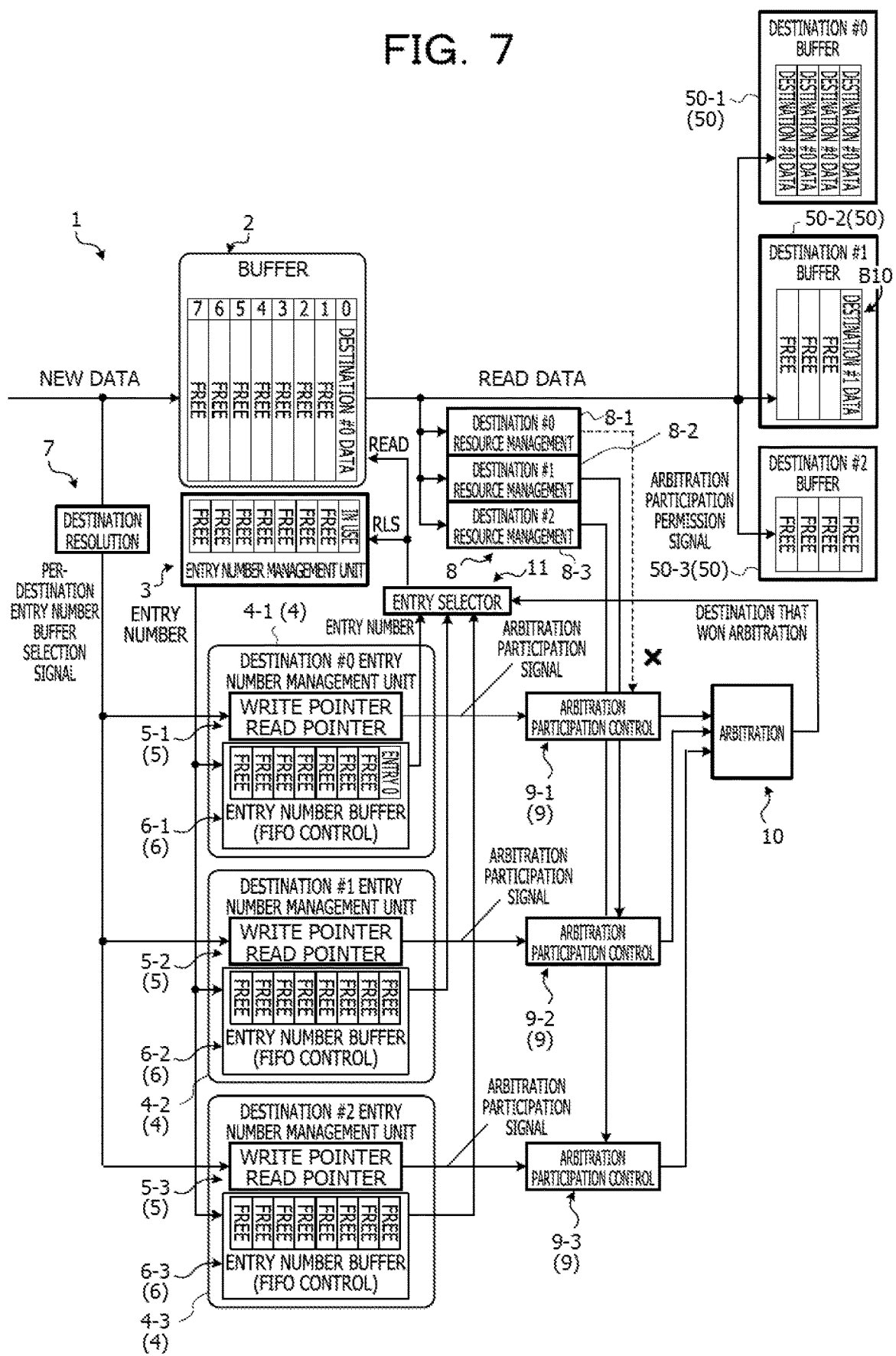
FIG. 7 is a diagram for describing a process in the buffer control system as an example of the embodiment.

Thereafter, the request read from the entry 1 of the buffer 2 is stored in the memory area of the destination #1 buffer 50-2, which is the destination of the request (see reference sign B10 in FIG. 7).

(C) Effects

As described above, according to the buffer control system 1 as an example of the embodiment, the entry number buffer 6 is provided for each destination buffer 50. Then, the entry number of an entry of the buffer 2 that stores the request is stored in the entry number buffer 6 corresponding to the destination of the request.

This allows the following request to be read from the buffer 2 by overtaking the preceding request, when the transmission of the preceding request to the destination (for example, the destination #0 buffer 50-1) is not feasible, but the transmission of the following request to the destination (for example, the destination #1 buffer 50-2) is feasible.

In the per-destination entry management unit 4, the entry number buffer 6 is controlled by FIFO, and the position indicated by the write pointer is compared with the position indicated by the read pointer of the write/read pointer 5. This enables easier determination on whether or not the entry number is stored in the entry number buffer 6, with a simple configuration. Accordingly, the arbitration participation signal may be output without delay, and the high-speed processing may be achieved.

Since the arbitration unit 10 performs arbitration for a plurality of write requests destined for different destination buffers 50, a request may be efficiently selected from the buffer 2 and processed when the transmission of requests to a plurality of destination buffers 50 is feasible.

(D) Others

The disclosed technique is not limited to the embodiment described above, and various modifications may be made without departing from the spirit of the present embodiment. Each of the configurations and processes of the present embodiment can be selected or omitted as needed or may be appropriately combined.

Furthermore, the present embodiment can be implemented and manufactured by those skilled in the art according to the above-described disclosure.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A semiconductor device comprising:
   a memory device configured to have a first buffer and a second buffer, the first buffer including a plurality of entries respectively storing a plurality of requests sent to a plurality of destinations, the second buffer being associated with a first destination of a first request written to first buffer, the second buffer storing identification information on at least one of the plurality of entries; and
   an entry selector configured to identify the first destination from the plurality of destinations in response to the identification information of the at least one of the plurality of entries being stored in the second buffer, and to read the first request from the plurality of requests stored in the first buffer by using the first destination.

2. The semiconductor device according to claim 1, wherein the entry selector is configured to:
   store the identification information on the plurality of entries of the first buffer in which the plurality of requests have been written, in a plurality of second buffers that correspond to the plurality of destinations of the plurality of requests, in response to writing of the plurality of requests into the first buffer,
   determine whether or not transmission of the plurality of requests to the plurality of destinations is feasible,
   perform arbitration for some of the plurality of destinations determined to be available for the transmission of the plurality of requests,
   specify one destination to which one of the plurality of requests is to be sent, from among the some of the plurality of destinations, and
   read the one of the plurality of requests from one of the plurality of entries of the first buffer specified by the identification information on the one of the plurality of entries acquired from one of the second buffers that corresponds to the one destination.

3. The semiconductor device according to claim 1, wherein the second buffer is controlled by first-in, first-out (FIFO).

4. The semiconductor device according to claim 3, wherein the memory device is configured to have position information that indicates a position of an oldest piece of the identification information on one of the plurality of entries in each of a plurality of second buffers; and have position information that indicates a position of a free area into which a next one of the plurality of requests is supposed to be written in each of the second buffers.

5. The semiconductor device according to claim 1, wherein the entry selector is configured to determine that transmission of the plurality of requests to the plurality of destinations is feasible when data storage areas at the plurality of destinations have free areas.

6. The semiconductor device according to claim 1, wherein the entry selector is configured to manage usage state for each of the plurality of entries of the first buffer.

\* \* \* \* \*